United States Patent [19]
Dix et al.

[11] Patent Number: 5,557,560
[45] Date of Patent: Sep. 17, 1996

[54] APPARATUS AND METHOD FOR PULSE COMPRESSION AND PULSE GENERATION

[75] Inventors: John Dix, Portland; Roderick A. Smith, Weymouth, both of United Kingdom

[73] Assignee: The Secretary of State for Defence in Her Britannic Majesty's Government of the United Kingdom of Great Britain and Northern Ireland, London, England

[21] Appl. No.: 244,243

[22] PCT Filed: Oct. 23, 1992

[86] PCT No.: PCT/GB92/01956

§ 371 Date: May 24, 1994

§ 102(e) Date: May 24, 1994

[87] PCT Pub. No.: WO93/08643

PCT Pub. Date: Apr. 29, 1993

[30] Foreign Application Priority Data

Oct. 23, 1991 [GB] United Kingdom .................. 9122446

[51] Int. Cl.⁶ .............................. G06J 1/00; G06F 15/31
[52] U.S. Cl. ................ 364/602; 364/724.01; 364/724.16
[58] Field of Search .................................... 364/602, 825, 364/724.01, 724.16, 724.17

[56] References Cited

FOREIGN PATENT DOCUMENTS 0312463  4/1989  European Pat. Off. .

OTHER PUBLICATIONS

Kimura et al, "Balanced Approximation of Digital FIR Filter with Linear Phase Characteristic", Inter. Symposium on Circuits and Systems Proceedings, vol. 1, 7 Jun. 1985 Kyoto, Japan, pp. 283–286.

Ralston et al, "A high speed digital correlator for compression and weighing of radar pulse returns", IEEE, NEREM RECORD; Signal Proceeding, vol. 15, 11 Aug. 1973, Boston US, pp. 209–215.

Kibbler, "The CLFM: A method of generating Linear Frequency–Coded Radar Pulses", IEEE Trans. on Aerospace and Electronic Syst. vol. AES–4, No. 3, May 1968 pp.385–391.

Vaidyanathan, "New Prefilters Bases on Chebyshev Polynomials for FIR digital filter design", Inter. Symposium on Circuits and Systems, Proceedings, vol. 1, 7 Jun. 1985 Kyoto, Japan, pp. 59–62.

Kikuchi et al, "A Design of Linear Phase FIR Digital Filters with Cyclotomic Resonators", Inter. Symposium on Circuits and System, Proceedings, vol. 1, 7 Jun. 1985, Kyoto, Japan, pp. 63–66.

Underwater Acoustics & Sonar Systems (continuing education course) vol 2: Signal Processing & Systems, Dept. of Electronic & Electrical Engineering, University of Birmingham, UK, 8 Apr. to 19th Apr. 1991.

Primary Examiner—Tan V. Mai
Attorney, Agent, or Firm—Nixon & Vanderhye

[57] ABSTRACT

A circuit and method for compressing or generating a pulse, particularly a chirp pulse, which uses infinite impulse response filtering (3.2). The infinite impulse response filters (3.9, 3.10, 3.11, 3.12) simulate the responses of finite impulse response filters. This is achieved by pre-processing the signal by passing it through a pre-processing filter (3.3) which has zero response at the resonant frequencies of the infinite impulse response filters (3.9, 3.10, 3.11, 3.12). The pre-processing and infinite impulse response filtering may be incorporated into a matched filter for detection of a chirp waveform input signal. This can be implemented in the time domain or the frequency domain. The matched filter also can incorporate beating to the base band techniques. The matched filter can also act as a generator by applying a pulse to the input which has the unit impulse function causing a chirp signal, equivalent to the transfer function of the filter, to be produced as the output.

17 Claims, 8 Drawing Sheets

APPARATUS AND METHOD FOR PULSE COMPRESSION AND PULSE GENERATION

BACKGROUND OF THE INVENTION

1. Field of the Invention

The present invention relates to pulse compression and pulse generation, in particular for compression or generation of chirp pulses.

2. Discussion of Prior Art

Pulse compression and generation are most commonly used in active sonar and radar applications. Active sonar or radar are used for the purpose of detection of objects by the emission of pulses and monitoring the return of the pulse reflections. It is not known at what point in time the reflected pulse will return and therefore it is necessary to monitor the return signal over the period of time in which the pulse is likely to return. The return signal also contains other elements. These are caused by background noise (marine and electrical), biological noise, mechanical noise and clutter. It is therefore necessary to identify the pulse reflection amongst these. Conventionally, this has been done by one of two methods; simple detection or matched filtering (correlation).

Correlation can be implemented in a number of ways but is computationally expensive operation and its achievement in real time requires a high degree of processing power and demands state of the art, thus expensive, technology.

This produces a filter which is a matched to a particular pulse and is known as a matched filter. A filter is said to be matched to a pulse when the transfer function (F[-t]) is the time reversed function of the pulse (F[t]). The output is said to be the compressed pulse. The width of the compressed pulse is proportional to the inverse of the bandwidth of the pulse and the amplitude is proportional to the duration of the pulse. If a pulse with the unit impulse function is applied to a matched filter input, a pulse, which has a function equivalent to the transfer function of the matched filter will be produced. In this way the matched filter can be used as a signal generator.

Matched filtering can be implemented in two ways, in the frequency domain or in the time domain. In the frequency domain it is implemented by digitizing the signal and then using Fast Fourier transform algorithms which, although efficient, require large amounts of computation for large BT products. Often compromise methods are used which give inaccurate results. In the time domain it is implemented using time delays, finite impulse response [FIR] filters and summation. It can be implemented using analogue techniques which requires a large amount of hardware or by digital algorithms which require large amounts of computation.

There are two major background elements in the return signal which need to be reduced. These are reverberation (a sonar term) or clutter (a radar term) and noise. The amount of clutter is reduced by enlarging the bandwidth. For a single frequency pulse, the bandwidth is proportional to the inverse of the pulse length and therefore, by shortening the pulse length, the bandwidth can be enlarged. The amount of noise is reduced by enlarging the pulse length. These two are in conflict with each other. One solution is to use a chirp waveform, a pulse with varying frequency. The bandwidth of a chirp waveform is the difference between the maximum and minimum frequencies. Therefore a large pulse (to reduce noise) with a large bandwidth (to reduce clutter) can be produced.

Often the techniques of signal processing are restricted by physical and financial constraints. These are weight, size and cost. For instance, the signal processing unit may be situated in a torpedo. Size and weight are therefore critical and must be kept to a minimum. Also, for this particular example, the signal processing unit is used only once before being destroyed and therefore, costs to produce it must also be kept to a minimum. The processing also has to be carried out in real time, which requires greater and faster computation, and therefore more hardware.

This invention aims to provide a means by which signals can be processed using less hardware and computation thus minimising weight, size and cost.

SUMMARY OF THE INVENTION

According to one aspect the present invention there is provided:

an electronic circuit for pulse compression or pulse generation comprising a filter which has a pre-selected transfer function, and uses infinite impulse response filtering to simulate the response of finite impulse response filtering characterised in that the pre-selected transfer function is a chirp waveform having discrete segments, each segment being of a single frequency and of integer number of wavelengths of that frequency in duration, the duration of each of the segments advantageously being the same.

Ideally, the frequencies of each segment are harmonics of one single fundamental frequency.

In one arrangement the circuit comprises a filter unit having:

a) a pre-processing filter, and b) an infinite impulse response (IIR) filter having a pre-determined resonant frequency connected to the output of the pre-processing filter;

the arrangement being such that the pre-processing filter has a zero transfer function at the resonant frequency of the IIR filter such that the filter unit simulates one segment of the pre-selected transfer function.

In a second arrangement in the frequency domain the circuit comprises a filter unit having:

a) an Analogue to Digital Converter (A/D) circuit;

b) a Fast Fourier Transform (FFT) circuit whose input is connected to the output of A/D circuit;

c) a set of time delays connected to the outputs of the FFT circuit to receive the different respective frequency components from the FFT circuit;

d) a reverse FFT circuit; connected to the outputs of the time delays; the arrangement being that the A/D circuit digitizes an electronic pulse present at the input thereof; the FFT circuit converts the digitized electronic pulse into the harmonic components of the fundamental frequency of the transfer function and the time delays delay each component by the equivalent period of time between the start of the transfer function and the start of the segment with the same frequency.

In an alternative arrangement for operation in the time domain the circuit comprises a matched filter having:

a) pre-processing filter;

b) a time delay module having a number of output taps connected to the output of the pre-processing filter;

c) IIR filters having pre-determined resonant frequencies connected to the output taps of the time delay module;

d) a summer having a plurality of inputs to which respective outputs of the IIR filters are connected;

the arrangement being such that the pre-processing filter has a zero transfer function at the resonant frequencies of each of the IIR filters; each IIR filter simulates one segment of the pre-selected transfer function; the duration of the time delays is equal to the duration of the corresponding segments.

In the arrangements described above the IIR filter can be implemented using resonators, for example, using of L-C tuned circuits, piezo-electric or quartz quarter wave resonators, microwave cavities, or state variable filters.

It is also possible to employ positive feedback in the IIR filter to modify the Q value.

In a practical arrangement the pre-processing filter used in the time domain implementations may comprise a delay and a subtractor wherein the input to the delay and the output from the delay are fed into the subtractor.

The time delay modules where used in the invention may be implemented using television delay lines, magnetostrictive delay lines, digital shift registers or digital memory devices.

In a second aspect for application in the time domain the invention provides:

a method for compression or generation of an electronic pulse comprising the step of selecting a filter, which uses infinite impulse response filtering to simulate finite response filtering, having a pre-selected transfer function, the pre-selected transfer function being that of a chirp wave form, characterised in that:

there are included the further steps of:

a) dividing the pre-selected transfer function into discrete separate frequency segments, each segment being of a single frequency and of integer number of wavelengths of that frequency in duration, b) providing pre-processing filters each having a zero response at one of the respective discrete frequencies, c) connecting the output signals from the pre-processing filters to respective IIR filters each selected to have a resonant frequency corresponding to the frequency of the zero response of the connected pre-processing filter, and d) summing the output signals from the IIR filters.

When applied to the frequency domain the invention provides:

a method for compression or generation of an electronic pulse comprising the step of selecting a filter, which uses infinite impulse response filtering to simulate finite response filtering, having a pre-selected transfer function characterised in that the pre-selected transfer function is that of a chirp waveform made up of discrete segments, each segment being of a single frequency and of integer number of wavelengths of that frequency in duration, the frequencies of each segment being harmonics of one single fundamental frequency, wherein:

there are included the further steps of:

a) digitizing an input signal using A/D converters b) converting the digitized signal into the harmonic components of the fundamental frequency of the transfer function using a FFT circuit c) delaying each harmonic component using a tapped time delay modules by the equivalent period of time between the start of the transfer function and the start of the segment with the same frequency;

d) converting the outputs of the time delay modules using a reversed FFT circuit into a signal in the time domain.

BRIEF DESCRIPTION OF THE DRAWINGS

Specific embodiments of the method and circuit will now be described by way of examples with reference to the accompanying drawings in which.

BRIEF DISCUSSION OF PREFERRED EMBODIMENTS

Figure 1:
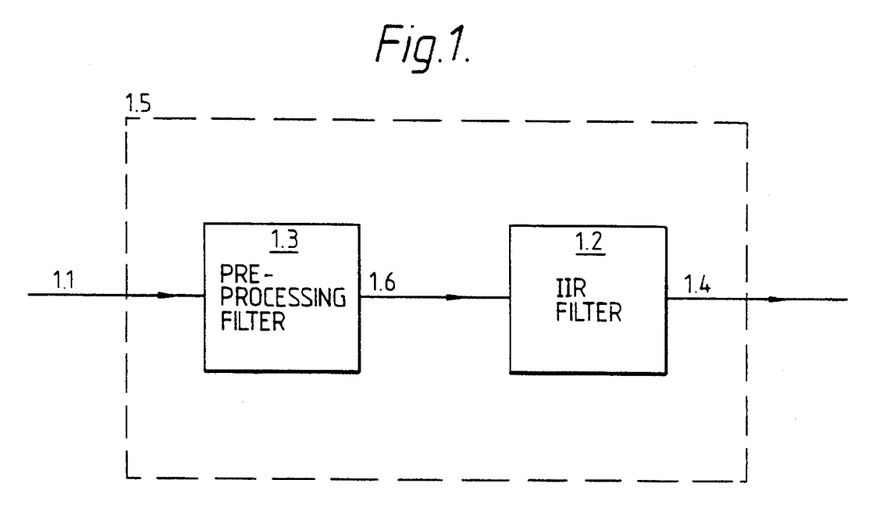
FIG. 1 This block diagram shows a pre-processing filter and a IIR filter which, when combined, simulate the response of a FIR filter.

The principle of the present invention is illustrated by the block diagram shown in FIG. 1. A signal at the input 1.1 passes through a pre-processing filter 1.3 and then through an IIR filter 1.2 to the output 1.4. The function of the IIR filter 1.2 is transformed into the function of a FIR filter by pre-processing the input signal with the pre-processing filter 1.3 which has zero response at the output 1.6 at the resonant frequency of the IIR filter 1.2. The combination of these simulate the response of the FIR filter 1.5.

Figure 2:
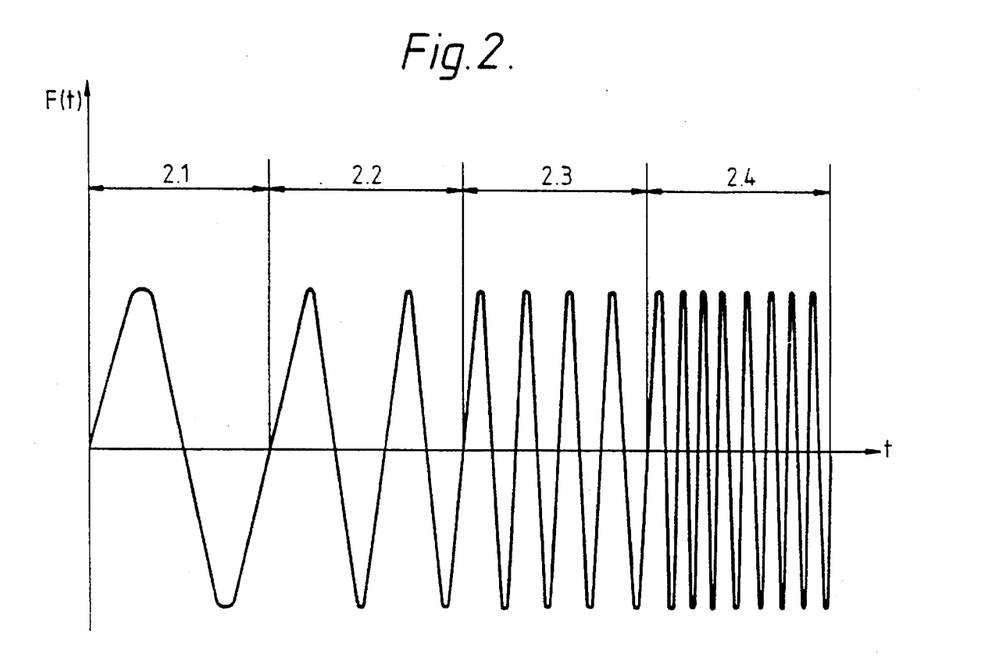
FIG. 2 This diagram shows a chirp waveform made up of discrete segments, each segment being of a single frequency and of integer number of wavelengths in length.
Figure 3:
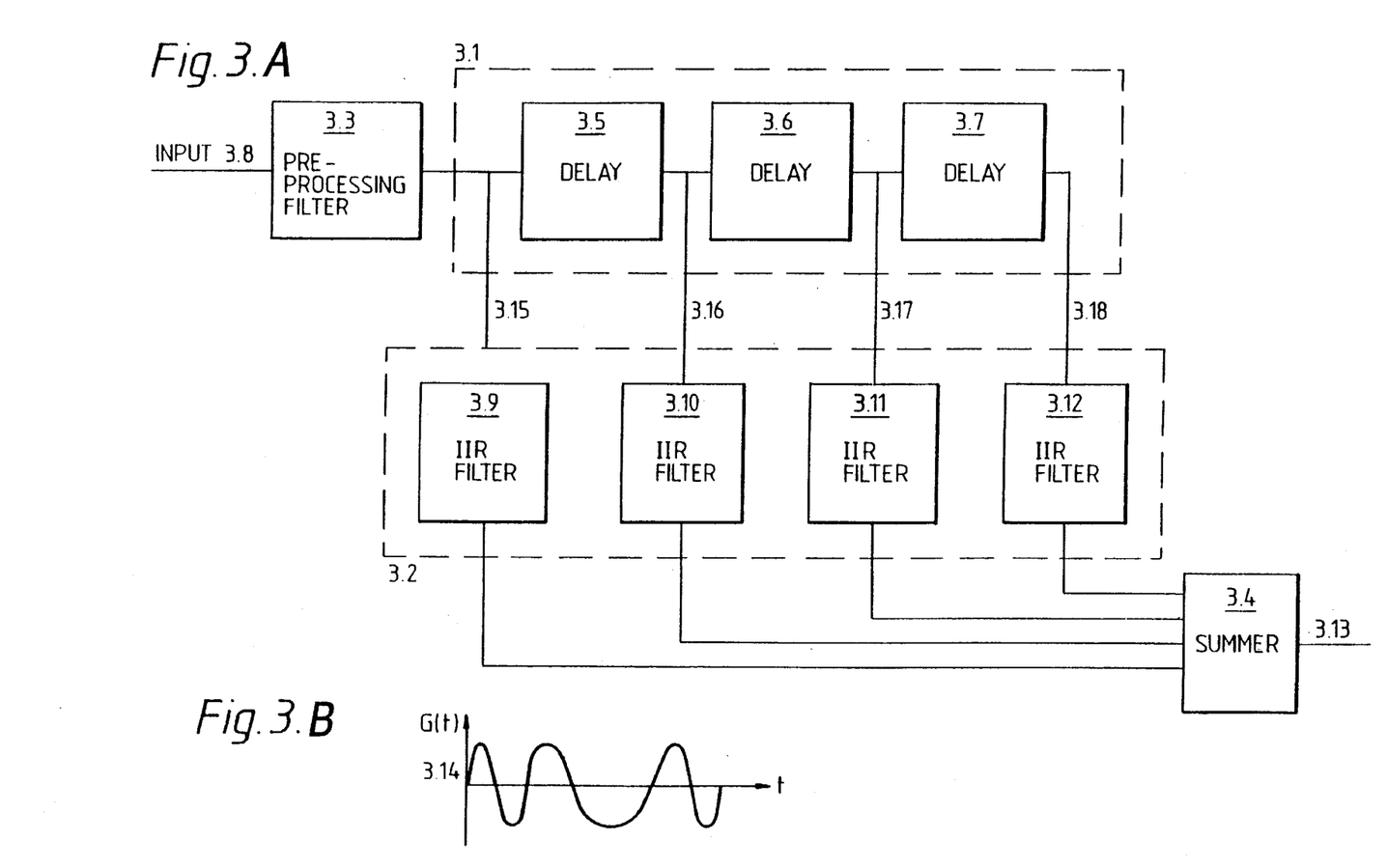
FIG. 3A This block diagram shows a matched filter implemented in the time domain, using pre-processing filters, a time delay module, IIR filters, and a summer.
FIG. 3B This diagram is the transfer function of the matched filter.
Figure 4:
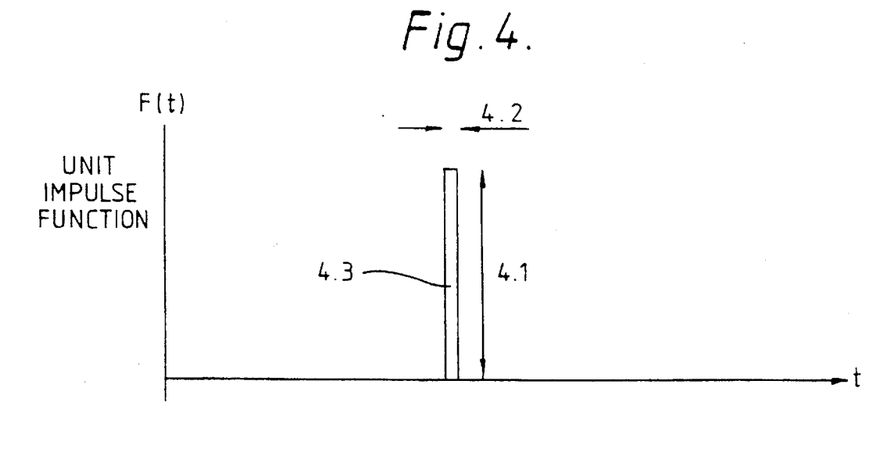
FIG. 4 This diagram shows the unit impulse function.

Use of the present invention enables either compression of a chirp waveform pulse or generation of a chirp waveform pulse using a matched filter implemented in the time domain. A convenient form of chirp waveform as shown in FIG. 2 is made up of discrete segments 2.1, 2.2, 2.3, 2.4, each segment being of a single frequency and of integer number of wavelengths of that frequency in duration. Preferably, all of the segments are equal in length. Preferably, all the frequencies are harmonics of a single frequency. The matched filter as shown in FIG. 3A with the transfer function shown in FIG. 3B comprises a tapped time delay module 3.1, IIR filters 3.2, a pre-processing filter 3.3, and a summer 3.4. The chirp waveform pulse at the input 3.8 is fed via the pre-processing filter 3.3 through the tapped time delay module 3.1 to the output taps 3.15, 3.16, 3.17, 3.18. Though the output of each tap 3.15, 3.16, 3.17, 3.18, can have several IIR filters attached preferably each tap 3.15, 3.16, 3.17, 3.18 has only one IIR filter 3.9, 3.10, 3.11, 3.12, attached as shown. The output response of the pre-processing filters 3.3 have zeros at the resonant frequencies of the IIR filters 3.2. This transforms the response of the components of the IIR filters 3.2 into the response of FIR filters. The matched filter is matched to the chirp waveform pulse by making the transfer function 3.14 of the filter equal to the time reversed function of the chirp pulse. This can be achieved by making the time delays 3.5, 3.6, 3.7 in the time delay module 3.1 equal to the time periods of the segments 1.1, 1.2, 1.3, of the chirp waveform pulse, excluding the last segment, and the resonant frequencies of the IIR filters 3.9, 3.10, 3.11, 3.12 equal to the frequencies of the segments 1.1, 1.2, 1.3, 1.4. Then, if a pulse with the unit impulse function, as shown in FIG. 4, is applied to the input 3.8 of the matched filter, a pulse is generated at the output 3.13 which is equivalent to the desired transfer function 3.14 of the matched filter. The unit impulse function is a pulse which has infinite magnitude 4.1 and zero duration 4.2 but has unit area 4.3.

Figures 5A, 5B:
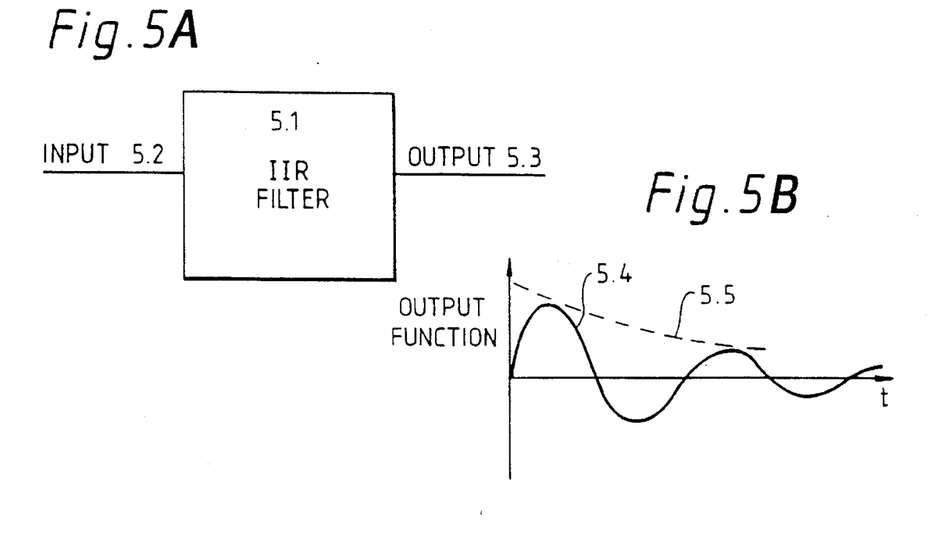
FIGS. 5A and 5B These diagrams show an IIR filter and its transient response respectively to a pulse which has the unit impulse function.
Figure 6:
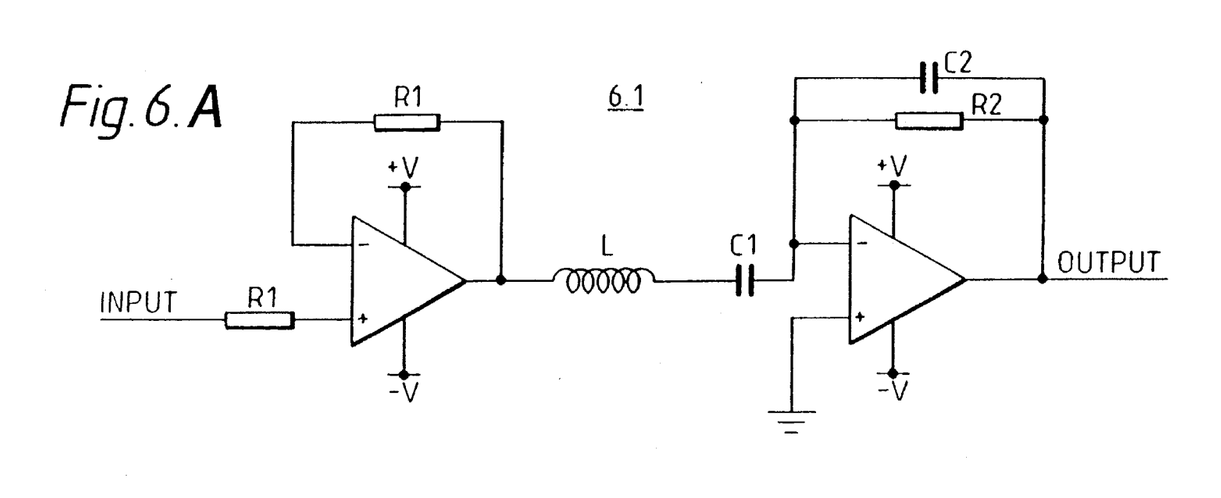
FIGS. 6A and 6B These diagrams show two examples of L-C resonators, a series resonator and a parallel resonator.
Figure 7:
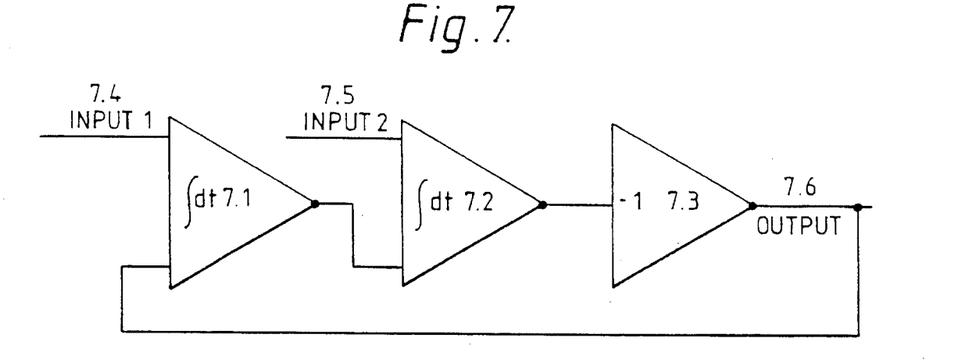
FIG. 7 This diagram shows a state variable filter, which can act as a resonator and can have two inputs with a phase difference of 90 degrees.

An IIR filter 5.1, as shown in FIG. 5A and its transient response as shown in FIG. 5B, is a filter that, when a pulse with the unit impulse function, as shown in FIG. 4, is applied at the input 5.2, the transient response 5.4 at the output 5.3 has an envelope 5.5 which never becomes zero in a finite period of time. IIR filters can be implemented using analogue circuits, particularly using resonators. The resonators are arranged to have resonant frequencies equal to the respective frequencies of the segments, 1.1, 1.2, 1.3, 1.4, of the chirp wave form pulse. It is preferable that the resonators have a high Q value so that the duration of resonant response is long compared to that of the duration of the corresponding segment of the chirp waveform pulse. The Q of a circuit is said to be "Quality factor" and is a measure of the sharpness of the peak of the function of the gain versus frequency at the resonant frequency of the circuit. Large values of Q can be problematic since they require large driving powers to evoke a sufficiently high response to be able to measure accurately. These resonators could be implemented as L-C tuned circuits, actively or passively. FIGS. 6A and 6B show two known examples which do not require detailed description; a series resonant circuit 6.1 in FIG. 6A and a parallel resonant circuit 6.2 in FIG. 6B. Theoretically, positive feedback can be used to modify the Q value. Also use could be made of mechanical resonators such as piezo-electric of quartz quarter wave resonators (for high frequency R.F. applications), or microwave cavities. At low frequencies, state variable filters consisting of two integrators, 7.1, 7.2, and an invertor, 7.3, may be used, as shown in FIG. 7. These have the advantage of having two possible inputs, 7.4 and 7.5, which are 90 degrees out of phase relative to each other. The signal 7.6 produced at the output of the invertor 7.3, as well as being fed back to the integrator 7.1, also serves as the output of the circuit.

Figure 8:
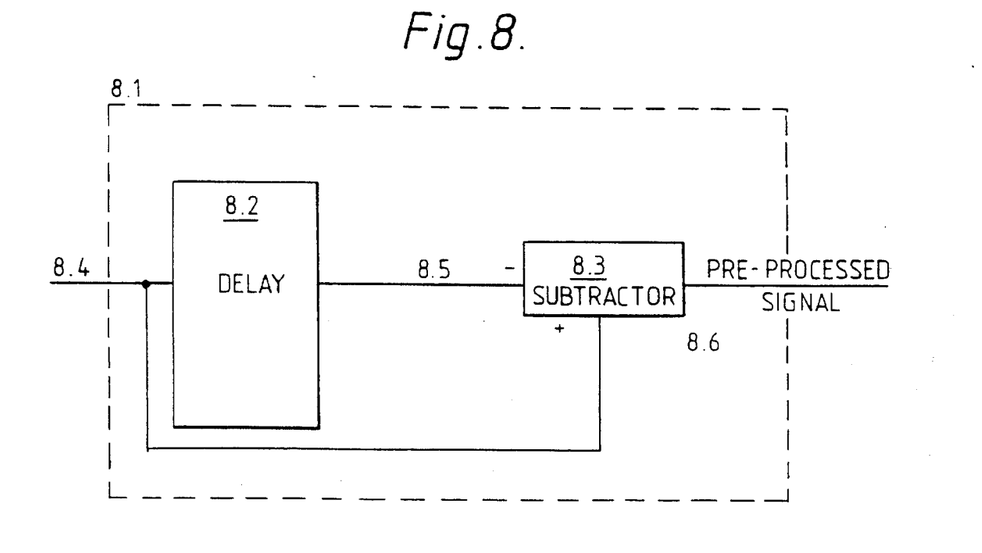
FIG. 8 This diagram shows a pre-processing filter using delay and subtraction.
Figure 9:
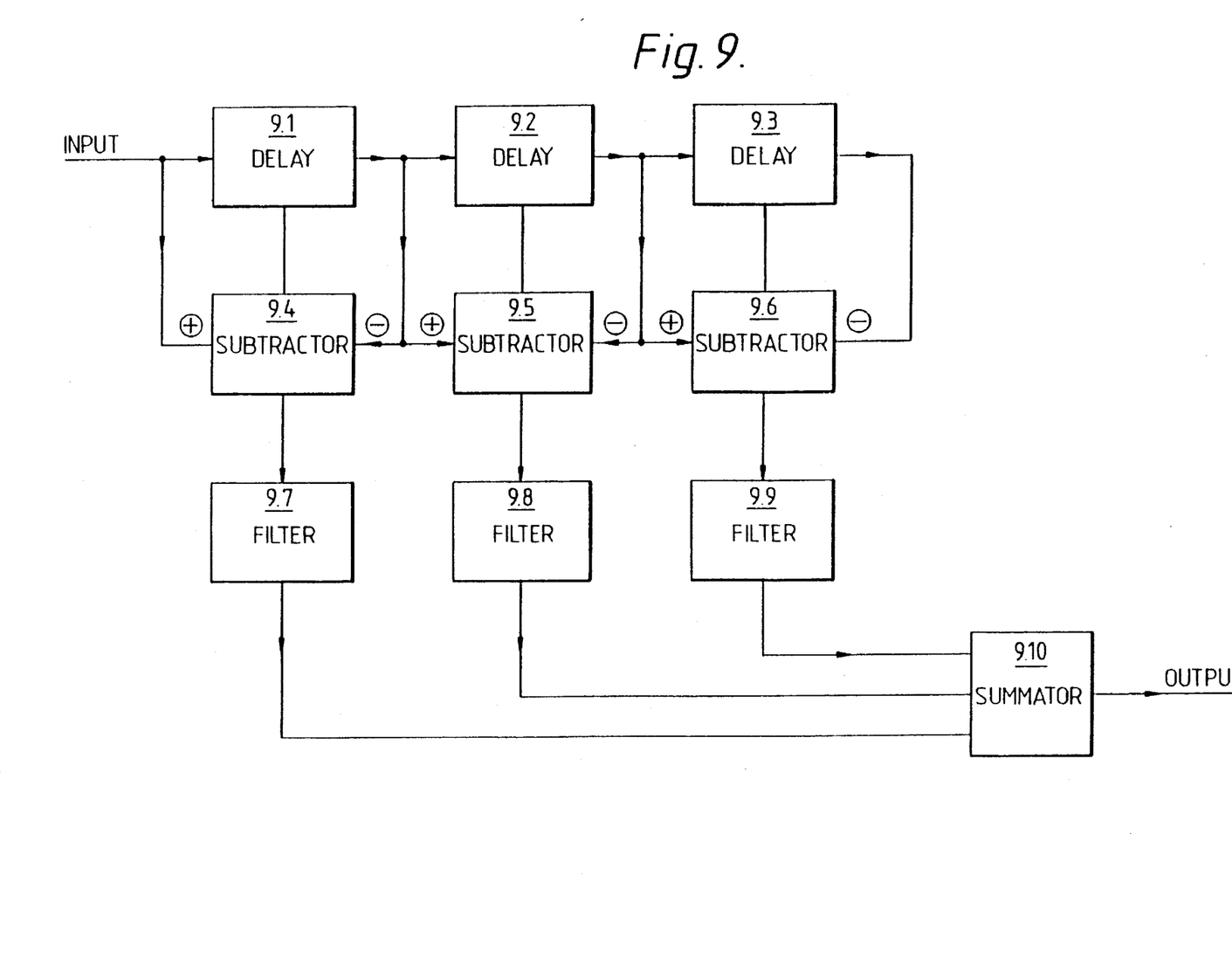
FIG. 9 This block diagram shows a matched filter with the time delay module being utilised for both the delay for the matched filter and for the delay in the pre-processing filter.

Pre-processing is performed using the pre-processing filter 3.3 which is designed to have zero response at the resonant frequencies of the IIR filters 3.2. Theoretically this can be implemented using any standard filtering techniques. Practically, the pre-processing filter 8.1 may be implemented as shown in FIG. 8 using a time delay 8.2 appropriate to a particular frequency and a subtractor 8.3. Each IIR filter 3.9, 3.10, 3.11, 3.12 then requires one pre-processing filter 8.1. The subtractor 8.3 in each pre-processing filter 8.1 subtracts a time delayed version of the input signal from the signal at the input 8.4. The delay introduced by the time delay 8.2 of a pre-processing filter 8.1 is equal to the period of the resonant frequency of the IIR filter. The same time delays in the module 3.1 used in the matched filter shown in FIGS. 3A and 3B can also be used for the time delays 8.2 in the pre-processing filters 8.1. An example of this is illustrated in FIG. 9 where the pre-processing filter illustrated with reference to FIG. 8 is incorporated in the matched filter illustrated in FIG. 3A. The delays 9.1, 9.2, 9.3, perform the same function as the time delay modules 3.5, 3.6, 3.7, of the FIG. 3A matched filter and simultaneously the same function as the time delay 8.2 in the pre-processing filter 8.1. The subtractors 9.4, 9.5, 9.6, each correspond to the subtractor 8.3 in the pre-processing filter 8.1. The IIR filters 9.7, 9.8, 9.9, and the summer 9.10 are equivalent to the IIR filters 3.2 and the summer 3.4 illustrated in FIG. 3A. If any or all of the frequencies of the pulse are harmonics of a single frequency, then only one pre-processing filter 8.1 is required to remove those frequencies, with a time delay 8.2 of the period of fundamental frequency.

There may be instances where there is difficulty in implementing a sufficiently high Q resonator. The response of the resonator can be compensated for by modifying the weighting to the signal either at the input 8.4 to the pre-processing filter or at either input 8.5 or 8.6 to the subtractor 8.3 in the pre-processing filter 8.1. This will also modify the transmission waveform, and reduce its effective form factor and hence its ability to discriminate against noise. In this case each resonator requires an individual pre-processing filter 8.1.

The tapped time delay module, 3.1, can be implemented as a single unit or as a combination of units. The time delay module, 3.1, may be implemented by using the time it takes for a signal to propagate through a medium, for example, television delay lines or magnetostrictive delay lines. It can be implemented using analogue electronics, for example using charge coupled devices or a series of sample and hold circuits. Preferably, the delays are be implemented digitally using shift registers or digital memory devices such as random access memory integrated circuits. If the delays are implemented digitally it is necessary to convert the signal into a digital signal; this can be achieved using an analogue to digital converter circuit. If the output of the delay module is required to be analogue, a digital to analogue converter circuits can be used.

The summer, 3.4, adds together the outputs of the IIR filters 3.2 and can be implemented either digitally or using analogue techniques. Preferably, the summation is carried out in a form consistent with the nature of the output of the IIR filters, 3.2.

All of the constituent parts of the matched filter as shown in FIG. 3A; the time delay module, 3.1, the pre-processing filter, 3.3, the IIR filters, 3.2, and the summer, 3.4, can be implemented, in part or as a whole, using digital algorithms implemented using dedicated integrated circuits, discrete digital integrated circuits, processor based circuits or by any combination of these.

Figure 10:
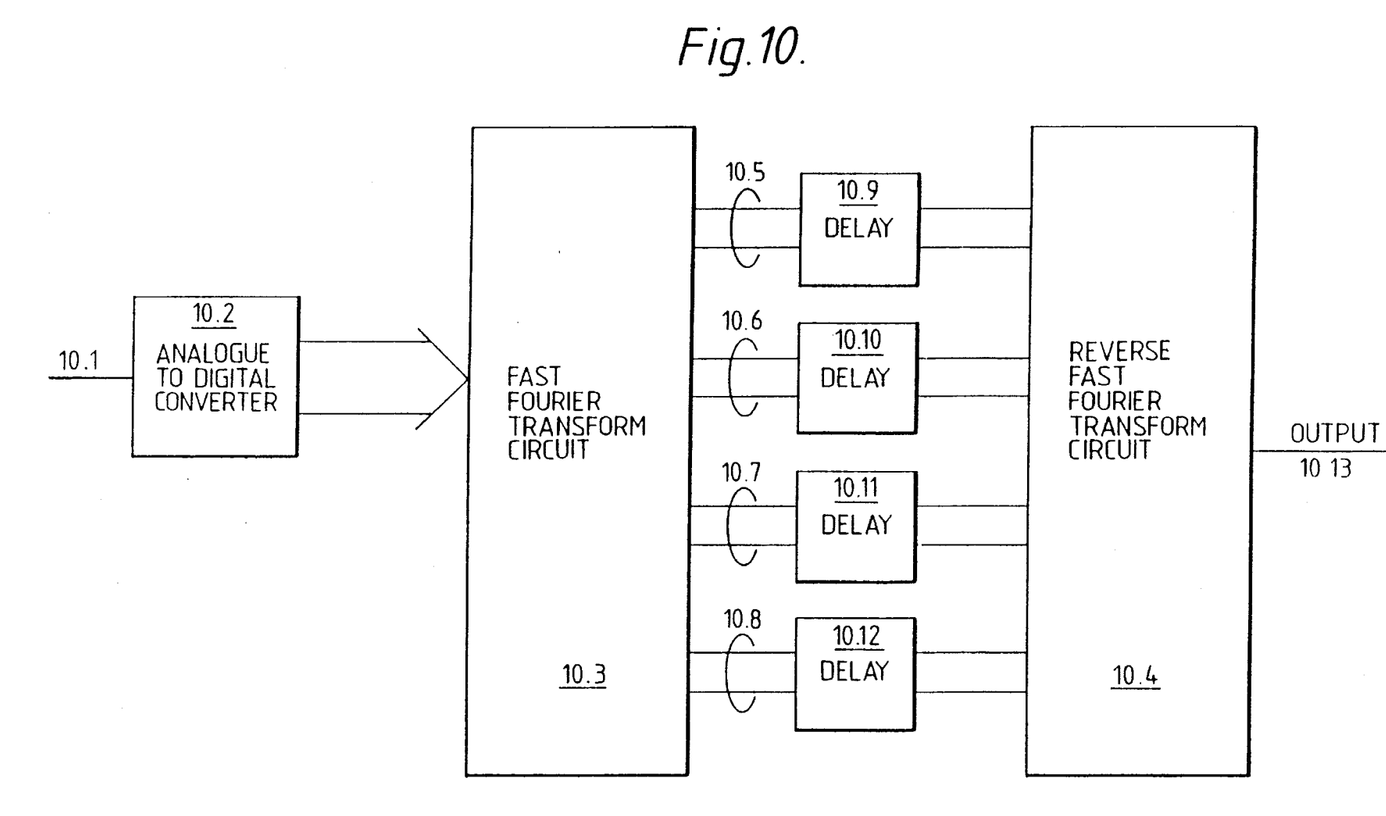
FIG. 10 This diagram shows a matched filter implemented in the frequency domain.

Another use of the present invention enables either compression of a chirp waveform pulse or generator of a chirp waveform pulse using a matched filter implemented in the frequency domain, as shown in FIG. 10. For this arrangement the pulse comprises a chirp waveform as shown in FIG. 2 which is made up of discrete segments 2.1, 2.2, 2.3, 2.4, each segment being of a single frequency and of integer number of whole wavelengths of that frequency in duration, all the frequencies being harmonics of one fundamental frequency. Preferably, all the segments are equal in length. Preferably, each segment 2.1, 2.2, 2.3, 2.4, has a unique frequency. The signal at the input 10.1 is digitized using analogue to digital circuits 10.2. A Fast Fourier transform (FFT) circuit, 10.3, is then used to generate the frequency components: the fundamental, 10.8, and the harmonics 10.5, 10.6, 10.7, of the signal for a given frequency. Preferably, this frequency is the same as the fundamental frequency of the pulse. Each of these components 10.5, 10.6, 10.7, 10.8, consists of two parts, a real part and an imaginary part. Each of these components 10.5, 10.6, 10.7, 10.8, are then delayed by respective delay modules, 10.9, 10.10, 10.11, 10.12. Preferably the duration of time of the time delay module 10.9, 10.10, 10.11, 10.12, is equal to the period of time between the start of the pulse and the start of the segment which has the same frequency as the component part. If two or more of the segments of the pulse contain the same frequency, then the equivalent component is fed through a tapped time delay module, the delay for the taps being equal to the duration of time between the start of the pulse and the start of the segments containing that frequency. The output of the delay modules are then converted back into a signal using a reverse FFT circuit 10.4. The response of this circuit to the chirp input signal is then the compressed pulse at the output 10.13.

Figure 11:
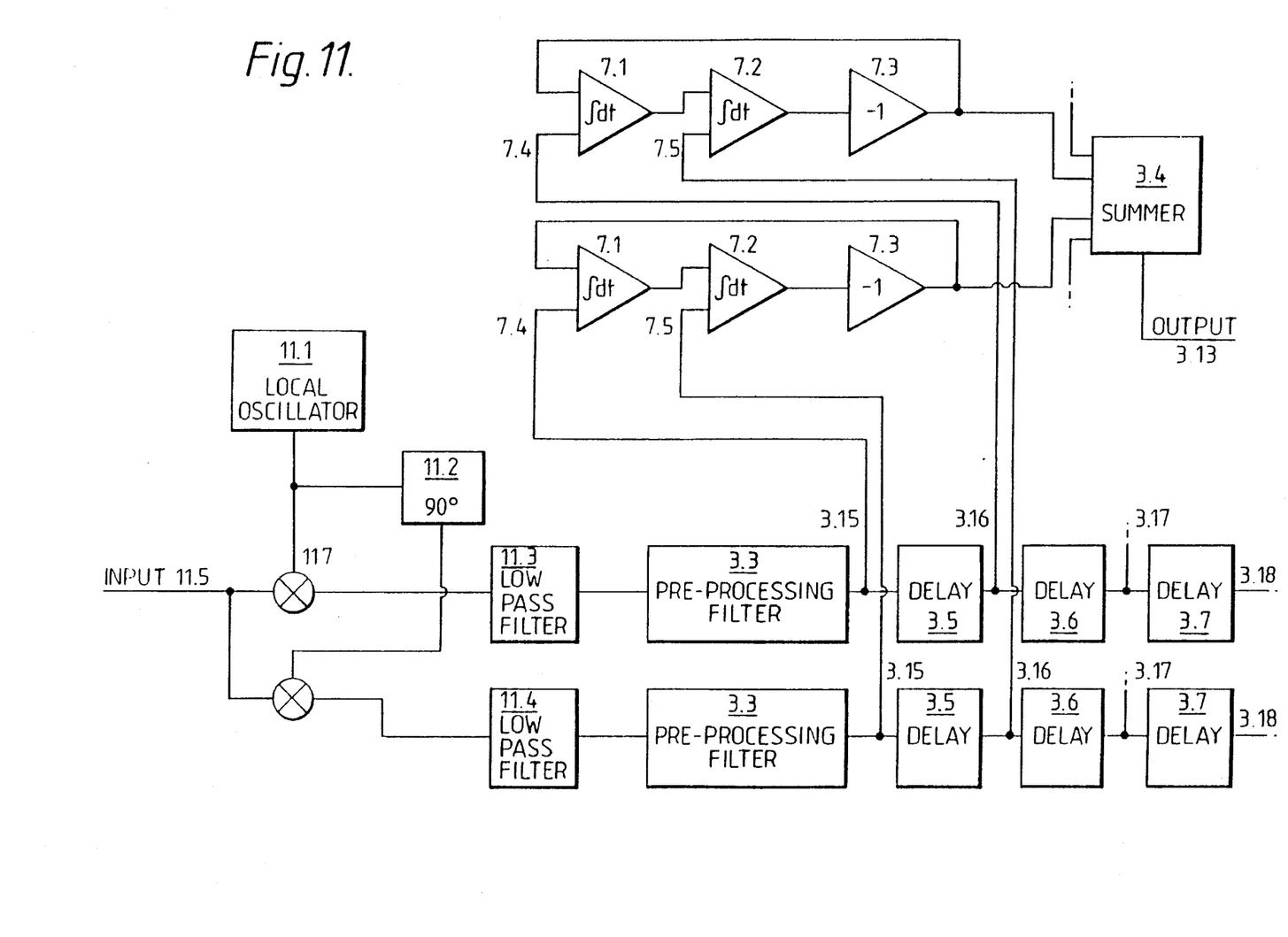
FIG. 11 This diagram shows the incorporation of beating to the base band technique in the present invention.

These implementations of the present invention can also incorporate beating to the base band as shown in FIG. 11. Beating to the base band is frequency shifting a signal to a lower frequency. The result of this is to produce a frequency shifted compressed pulse. The input signal is a chirp waveform pulse as shown in FIG. 2 which is made up of discrete segments 2.1, 2.2, 2.3, 2.4, each segment being of a single frequency and of integer number of wavelengths of that frequency in duration. If the matched filter is implemented in the frequency domain then all of the frequencies of each of the segments 2.1, 2.2, 2.3, 2.4, are harmonics of one single frequency. The signal at the input 11.5 is multiplied, using a multiplier 11.7, by the output of a local oscillator 11.1 which results in the sum and difference signals being produced; i.e. one at a relatively high frequency, one at a low frequency. It is the signal with the smaller frequency that is usually sought. The frequency of the local oscillator 11.1 is chosen so that the resulting frequency of the low frequency signal is the one desired. The signal from the output of the multiplier 11.7 is then passed through a low pass filter 11.3 to remove the higher frequency signal. Because it is not known at what phase the signal is being multiplied with the local oscillator, a second phase quadrature channel is provided in which the signal at the input 11.5 is multiplied, using a multiplier 11.6, by the output signal of the local oscillator 11.1 phase shifted by 90 degrees by a phase shifter 11.2. The output of the multiplier 11.8 is then passed through a low pass filter 11.4 identical to filter 11.3 used on the other channel. The two channel output signals from the low pass filters 11.3 and 11.4 are then fed into identical matched filters as previously described except for the following. When implemented in the time domain, the signals at the outputs of corresponding taps 3.15, 3.16, 3.17, 3.18, are fed into the two inputs 7.4 and 7.5 of a resonator as shown in FIG. 7. This performs the function of an IIR filter and, because the inputs are 90 degrees out of phase relative to each other, a vector adder. The outputs 7.6 of the resonators are then summed in the summer 3.4 to produce the output signal at the output. Alternatively, the signal at the output of each tap 3.15, 3.16, 3.17, 3.18, can be passed through an individual IIR filter, the resulting signals at the corresponding outputs then being vector added using vector adders. The outputs of the vector adders are then summed in the summer 3.4 to produce the output signal at the output 3.13. When implemented in the frequency domain, the outputs of the corresponding time delays 10.9, 10.10, 10.11, 10.12 as shown in FIG. 10 are converted directly, using reversed Fast Fourier transform circuit 10.4, into the output signal at the output 10.13. All of the constituent parts of the beating to base band technique can be implemented in part or as a whole using digital algorithms.

The present invention has applications in remote sensing and signal processing, where high resolution is usually limited by the processing and the transducers available. It is also particularly applicable in areas where size, weight and cost have to be kept to a minimum. It is appropriate for the use in active sonars and radars, as well as medical and seismic sensing.

The method may also be applied to the spatial domain by, for example, multiplexing sequentially through the elements of an array to produce a steered received beam, corresponding to a particular spatial frequency distribution across the face of an array.

We claim:

1. An electronic circuit for pulse compression or pulse generation comprising a filter which has a pre-selected transfer function and uses infinite impulse response filtering to simulate the response of finite impulse response filtering wherein said filter comprises a filter unit having:

a) a pre-processing filter, and b) an infinite impulse response (IIR) filter having a pre-determined resonant frequency connected to the output of the pre-processing filter;

the arrangement being such that the pre-processing filter has a zero transfer function at the resonant frequency of the IIR filter such that the filter unit simulates one segment of the pre-selected transfer function, said pre-selected transfer function is that of a chirp waveform, made up of discrete segments, each segment being of a single frequency and of integer number of wavelengths of that frequency in duration.

2. An electronic circuit for pulse compression or pulse generation as claimed in claim 1 characterised in that the duration of each of the segments is the same.

3. An electronic circuit for pulse compression or pulse generation as claimed in claim 1 characterised in that the frequencies of each segment are harmonics of one signal fundamental frequency.

4. An electronic circuit for pulse compression and pulse generation as claimed in claim 1 characterised in that: the circuit comprises a matched filter having:

a) pre-processing filter;

b) a time delay module having a number of output taps connected to the output of the pre-processing filter;

c) IIR filters having pre-determined resonant frequencies connected to the output taps of the time delay module;

d) a summer having a plurality of inputs to which respective outputs of the IIR filters are connected;

the arrangement being such that the pre-processing filter has a zero transfer function at the resonant frequencies of each of the IIR filters; each IIR filter simulates one segment of the pre-selected transfer function; the duration of the time delays is equal to the duration of the corresponding segments.

5. An electronic circuit for pulse compression and pulse generation as claimed in claim 4 characterised in that the IIR filter is implemented using resonators.

6. An electronic circuit for pulse compression and pulse generation as claimed in claim 4 characterised in that the IIR filter uses positive feedback to modify the Q value.

7. An electronic circuit for pulse compression and pulse generation as claimed in claim 4 characterised in that the time delay module is implemented using television delay lines, magnetostrictive delay lines, digital shift registers or digital memory devices.

8. An electronic circuit for pulse compression and pulse generation as claimed in claim 1 characterised in that the pre-processing filter comprises of a delay and a subtractor wherein the input to the delay and the output from the delay are fed into the subtractor.

9. An electronic circuit for pulse compression or pulse generation comprising a filter which has a pre-selected transfer function and uses infinite impulse response filtering to simulate the response of finite impulse response filtering characterised in that the pre-selected transfer function is that of a chirp waveform, made up of discrete segments, each segment being of a single frequency and of integer number of wavelengths of that frequency in duration, wherein the frequencies of each segment are harmonics of one single fundamental frequency, the circuit comprises a filter unit having:

a) an Analogue to Digital Converter (A/D) circuit;

b) a Fast Fourier Transform (FFT) circuit whose input is connected to the output of A/D circuit;

c) a set of time delays connected to the outputs of the FFT circuit to receive the different respective frequency components from the FFT circuit; and d) a reverse FFT circuit connected to the outputs of the time delays;

the arrangement being that the A/D circuit digitized an electronic pulse present at the input thereof; the FFT circuit converts the digitized electronic pulse into the harmonic components of the fundamental frequency of the transfer function and the time delays delay each component by the equivalent period of time between the start of the transfer function and the start of the segment with the same frequency.

10. A method for compression or generation of an electronic pulse comprising the step of selecting a filter, which uses infinite impulse response filtering to simulate finite response filtering, having a pre-selected transfer function, the pre-selected transfer function being that of a chirp waveform, characterised in that:

there are included the further steps of:

a) dividing the pre-selected transfer function into discrete separate frequency segments, each segment being of a single frequency and of integer number of wavelengths of that frequency in duration, b) providing pre-processing filter having a zero response at each of the respective discrete frequencies, c) connecting the output signal from the pre-processing filter to respective IIR filters, each selected to have a resonant frequency corresponding to the frequency of one of the zero responses of the pre-processing filter, and d) summing the output signals from the IIR filters.

11. A method for compression or generation of an electronic pulse as claimed in claim 10 characterised in that said method is implemented in part or as a whole using digital algorithms implemented using discrete digital circuits, dedicated integrated circuits, processor based circuits or any combination of these.

12. A method for compression or generation of an electronic pulse as claimed in any one of claim 10 characterised in that the method is used for beam steering following time division multiplexing of the signals from array elements and utilising the method to separate the spatial frequency of beams from a number of directions.

13. A method for compression or generation of an electronic pulse as claimed in claim 10 characterised in that the method incorporates beating to the base band technique.

14. A method for compression or generation of an electronic pulse comprising the step of selecting a filter, which uses infinite impulse response filtering to simulate finite response filtering, having a pre-selected transfer function characterised in that the pre-selected transfer function is that of a chirp waveform made up of discrete segments, each segment being of a single frequency and of integer number of wavelengths of that frequency in duration, the frequencies of each segment being harmonics of one single fundamental frequency, wherein:

there are included the further steps of:

a) digitizing an input signal using an A/D converter, b) converting the digitized signal into the harmonic components of the fundamental frequency of the transfer function using a FFT circuit, c) delaying each harmonic component using a tapped time delay modules by the equivalent period of time between the start of the transfer function and the start of the segment with the same frequency; and d) converting the outputs of the time delay modules using a reversed FFT circuit into a signal in the time domain.

15. A method for compression or generation of an electronic pulse as claimed in claim 14 characterised in that said method is implemented in part or as a whole using digital algorithms implemented using discrete digital circuits, dedicated integrated circuits, processor based circuits or any combination of these.

16. A method for compression or generation of an electronic pulse as claimed in claim 14 characterised in that the method is used for beam steering following time division multiplexing of the signals from array elements and utilising the method to separate the spatial frequency of beams from a number of directions.

17. A method for compression or generation of an electronic pulse as claimed in claim 14 characterised in that the method incorporates beating to the base band technique.

* * * * *